United States Patent [19]

Squire

[11] Patent Number: 4,580,092

[45] Date of Patent: Apr. 1, 1986

[54] POCKET SIZE ANTENNA MATCH INDICATOR FOR VSWR MEASUREMENT

[75] Inventor: Gerald K. Squire, Middletown, Ohio

[73] Assignee: The United States of America as represented by the Secretary of the Air Force, Washington, D.C.

[21] Appl. No.: 506,919

[22] Filed: Jun. 22, 1983

[51] Int. Cl.[4] ...................... G01R 27/00; G01R 27/04
[52] U.S. Cl. .................................. 324/57 R; 324/58 B
[58] Field of Search .............. 324/57 R, 58 B, 58.5 B, 324/95, 98, 58 R, 58.5 R; 455/115, 67

[56] References Cited

U.S. PATENT DOCUMENTS

| | | | |
|---|---|---|---|
| 3,031,615 | 4/1962 | Chase et al. | 324/58 B |
| 4,034,289 | 7/1977 | Rozylowicz et al. | 324/95 |
| 4,110,685 | 8/1978 | Leenerts | 324/58 B |
| 4,196,394 | 4/1980 | Adams | 455/289 |
| 4,290,009 | 9/1981 | Sanpei et al. | 324/57 R |
| 4,479,087 | 10/1984 | Althouse | 324/58 B |

OTHER PUBLICATIONS

Shurmer, A Direct-Reading Waveguide Standing-Wave Detector for Use at Low Power Levels, Proc. of IEE, vol. 102, No. 2, Part C, Sep. 1955, pp. 176–180.

Primary Examiner—Reinhard J. Eisenzopf
Assistant Examiner—Jack B. Harvey
Attorney, Agent, or Firm—Donald J. Singer; Thomas L. Kundert

[57] ABSTRACT

A pocket size antenna match indicator is described having a self contained modulated low level RF signal source which is applied to an antenna or other load under test through a dual directional coupler. Sampled RF reflected signals are detected, filtered and amplified to provide a DC voltage directly proportional to antenna mismatch. Easy to read measurement of VSWR is derived from the DC voltage by means of a dot display driver connected to a LED display.

13 Claims, 4 Drawing Figures

POCKET SIZE ANTENNA MATCH INDICATOR FOR VSWR MEASUREMENT

RIGHTS OF THE GOVERNMENT

The invention described herein may be manufactured and used by or for the Government of the United States for all governmental purposes without the payment of any royalty.

BACKGROUND OF THE INVENTION

The present invention relates to test instruments for measuring the impedance match between an antenna and a RF transmitter, and more particularly to a self contained pocket size antenna match indicator for providing a visual readout of voltage standing wave ratio (VSWR).

U.S. Pat. No. 4,110,685 to Leenerts is illustrative of a prior standing wave ratio measurement instrument useful for matching the impedance of a transmitter and an antenna. Two directional couplers are inserted in the transmission line to produce an output voltage indicative of forward and reflected RF power. The voltages are applied to analog circuitry for generating a signal proportional to the return loss. The signal is coupled to an analog display meter calibrated to provide a direct reading of the VSWR.

Measurement instruments of the type disclosed in the Leenerts patent are inserted in the transmission line between the transmitter and antenna, and rely on the transmitter as the source of RF power. Such arrangements often require the use of moderate to high RF power levels (i.e. +30 dBm and higher) to compensate for transmitter impedance peculiarities and instrument sensitivities, thus presenting potential serious hazard to personnel while tuning or adjusting the antenna. The prior art instruments present other difficulties in working at antennas located at remote ends of a transmission line. For example, the equipment is bulky and not well suited for use in adverse weather conditions, remote or poor access areas, or in darkness. Also, the measurement equipment is susceptable to extraneous RF signal radiations.

In view of the foregoing, it would be highly desirable to have a simple and rapid means of checking or adjusting the match condition of an antenna which does not rely on the RF transmitter as the signal source. What is needed is an antenna match instrument having a self contained low level RF power source that could be used independently of the transmitter. It would further be desirable to provide such a wholly self contained antenna match indicator that is inexpensive and which does not require a high degree of technical skill or knowledge to operate.

It is therefore an object of the present invention to provide a small, inexpensive antenna match indicator having a self contained low level RF signal source.

It is another object of the invention to provide a VSWR indicator which is ideally suited for use in remote or poor access areas and which does not impair or present a hazard to the operator due to size, complexity of operation, or power level.

It is yet another object of the invention to provide a VSWR indicator of sufficiently low power level that it will not cause significant RF radiation from an antenna under test.

It is another object of the invention to provide a VSWR indicator having an easy to read digital display readout comprising individual light emitting diode (LED) display segments indicative of direct measured VSWR values.

It is another object of the invention to provide a VSWR indicator having a moving dot type display to provide a readily ascertainable indication of a good or bad antenna match even in poor visibility.

SUMMARY OF THE INVENTION

The invention is directed to a portable, self contained pocket size antenna match indicator device which is very simple to operate, and which provides a direct readout of VSWR. The instrument is battery operated and contains its own internally tunable low level RF signal source. Antennas, antenna matching networks or other loads whose impedance is to be checked or adjusted are connected through a coaxial cable connector to the indicator. A directional coupler connected between the RF signal source and the cable connector samples the forward and reflected flow of the signal. The reflected component is detected and amplified to produce a DC voltage proportional to load mismatch at the cable connector. A LED moving dot digital display converts the DC voltage to a visual indication of VSWR.

Other features and advantages will be apparent from the following description and claims, and are illustrated in the accompanying drawings which show an embodiment of the invention.

DETAILED DESCRIPTION

Figure 1:
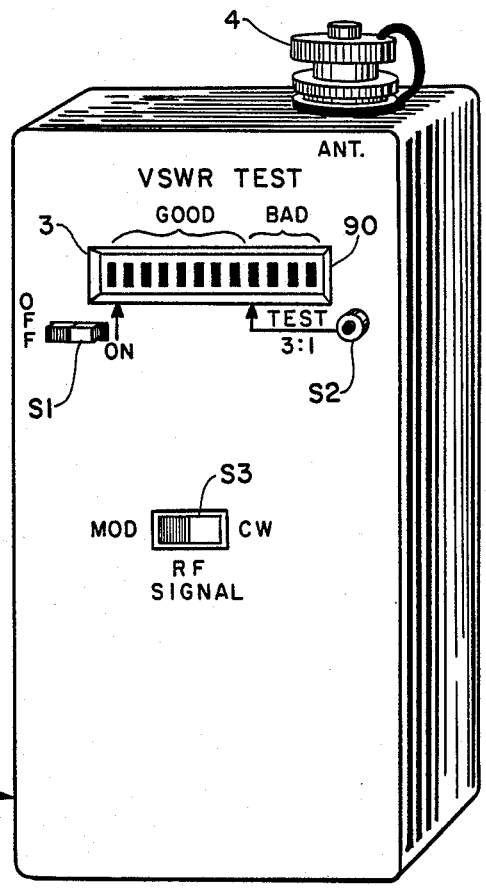
FIG. 1 is a perspective view of the pocket size self contained antenna match indicator according to the invention.

FIG. 1 illustrates the antenna match indicator according to the invention. The indicator may be contained in a small housing 2 of dimensions about the size of a pocket calculator. An opening 3 is provided on the face of the housing for a digital display 90. External controls to operate the indicator are an on/off switch S1, test button switch S2, and RF signal selector switch S3. Antennas, antenna matching networks or other loads whose impedance are to be checked or adjusted are connected to the unit through conventional coaxial cable connector 4. The indicator is battery operated and contains an internally tunable low level RF signal source. The oscillator and other circuitry are mounted on printed circuit cards and contained within the housing 2 along with the battery power supply. Access to the circuitry to make frequency gain and modulation adjustments, and access to the batteries are made through a back cover (not shown) of housing 2.

Figure 2:
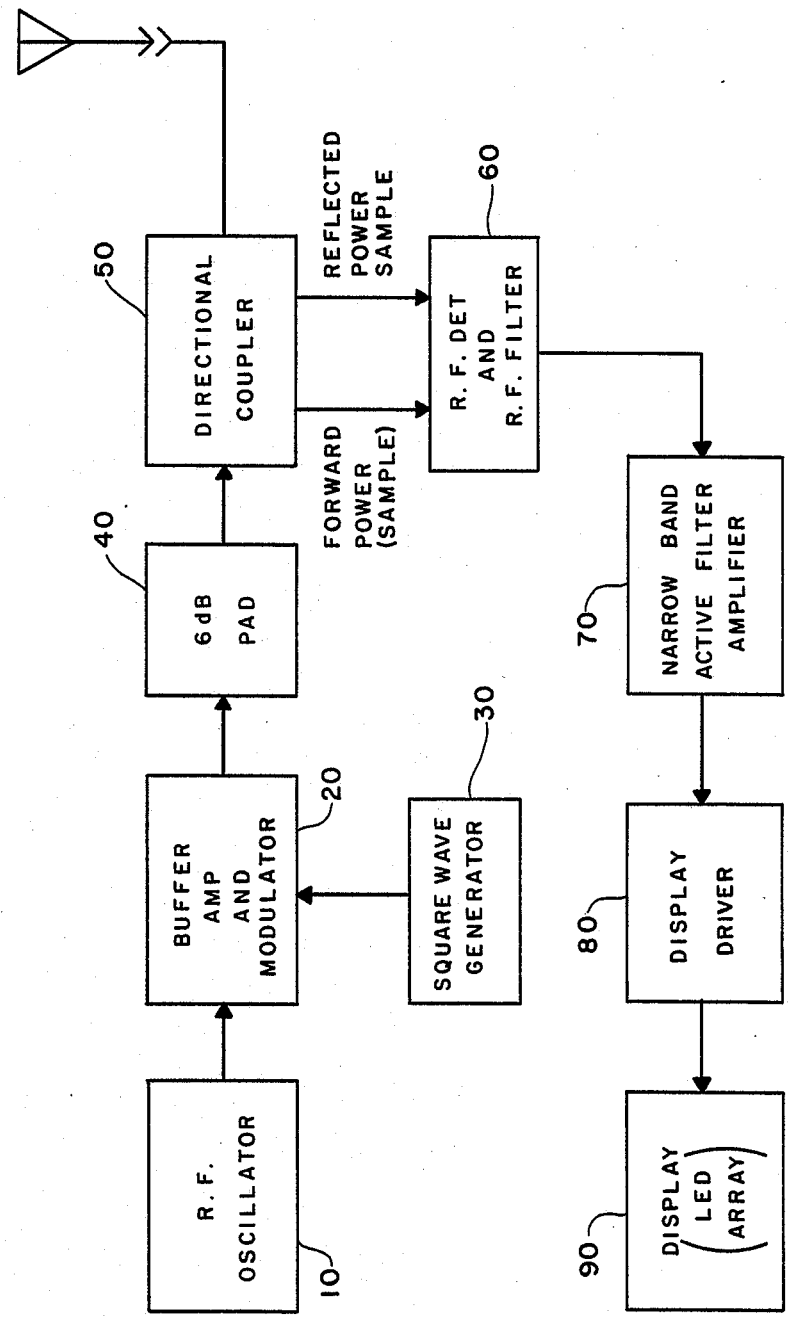
FIG. 2 is a block diagram of the circuit of the antenna match indicator.

FIG. 2 shows a block diagram of the indicator circuitry. The signal source is provided by a RF oscillator 10. The oscillator may be of the fixed-tuned type but is preferably tunable over a moderate bandwidth and has a low level output power, typically 15 to 20 milliwatts. Oscillator 10 is connected to a buffer amplifier 20 where the RF signal is modulated by a square wave signal provided by a square wave generator 30. The modulated signal is applied to the antenna (shown in the figure) or other load under test through a 6 db pad 40, and a dual directional coupler 50 from which both forward and reflected RF signals are sampled. The reflected RF signal is proportional to the VSWR of the load at antenna coaxial cable connector 4. The sampled RF reflected signal is coupled to a detector and filter circuit 60 and thereafter amplified by a narrowband filter amplifier 70 to produce a DC voltage directly proportional to the antenna terminal mismatch. This voltage is applied to a display control driver 80 which is calibrated in terms of VSWR. The driver actuates a light emitting diode (LED) display 90 to provide a readout of the VSWR.

Figure 3:
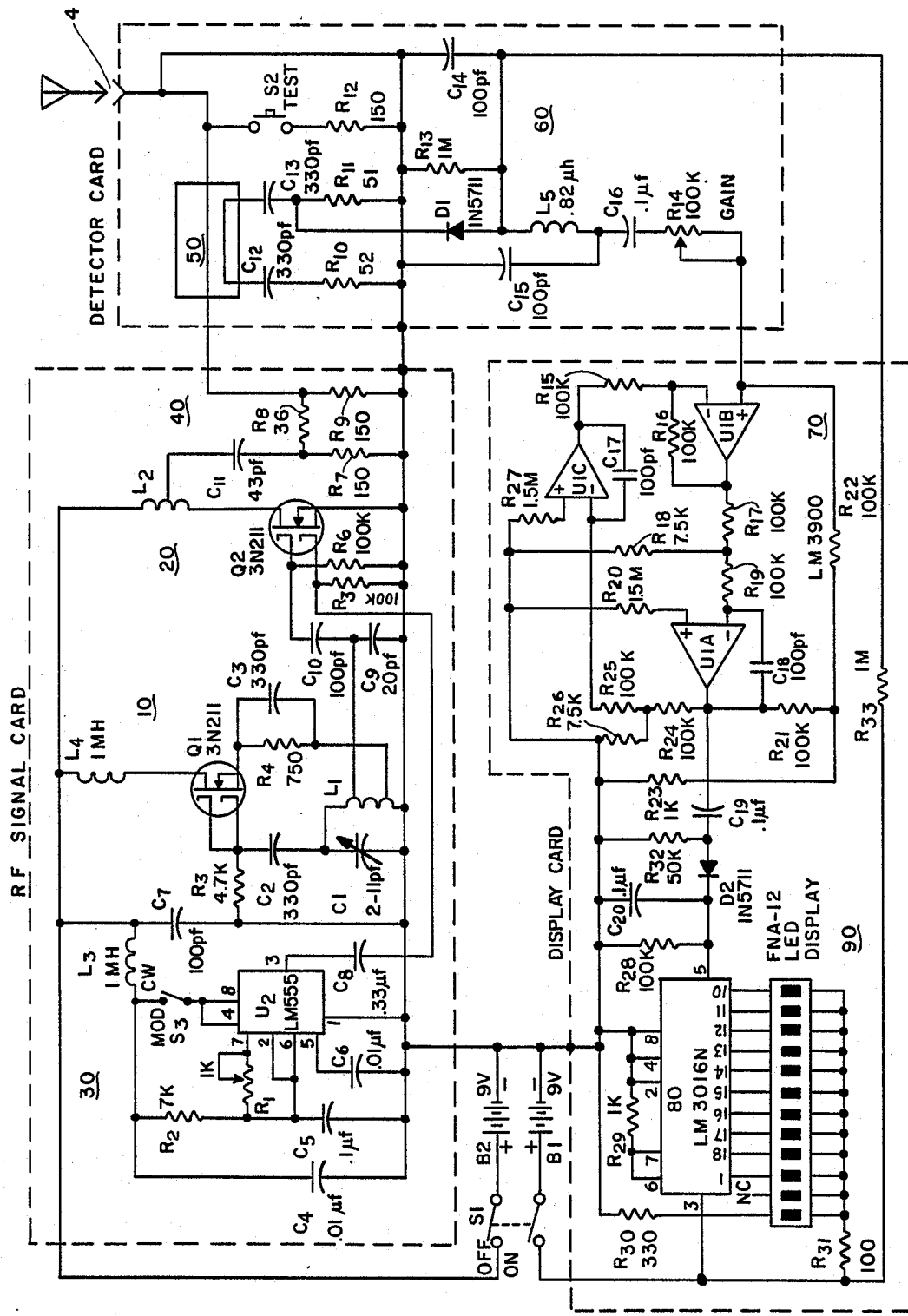
FIG. 3 is a schematic showing in greater detail the circuit of FIG. 2.

FIG. 3 is a schematic showing in greater detail the block diagram of FIG. 2. The overall circuit is preferably powered by two 9 VDC batteries B1 and B2, with one of the batteries powering the display circuit and the other powering the RF and modulator circuitry. Switch S1 provides ON/OFF control. It will be understood by those skilled in the art that the circuit could operate on the single battery or could be powered by other known power supply means. Furthermore it will be understood that fixed-tuned, crystal or tunable circuit designs may be used in the RF oscillator and square wave generator.

For purposes of illustration the RF signal is generated by a Hartley oscillator circuit having a dual GATE MOSFET 3N211 (Q1). Inductor L1, capacitors C1 and C9 are the frequency determining components of the oscillator. Capacitor C1 is adjustable to permit the RF frequency to be varied over a 10% bandwidth. A lower tap on inductor L1 provides excitation via the source current from MOSFET Q1. Resistor R4 provides a DC bias to the source and capacitor C3 provides a RF bypass across resistor R4. Resistor R3 acts as a bleeder resistor providing a DC path to ground for the gates. Capacitor C2 couples RF tank circuit (C1, L1) to the gates. Frequency of the oscillator is 140±6 MHz, although frequency may range from 10–500 MHz and is selected for specific applications. The low frequency limit is controlled primarily by the low frequency limit of the directional coupler 50. Replacement of MOSFET 3N211 with a 3N200 or similar high frequency transistor may be required at the high frequency range.

A second dual gate MOSFET 3N211 (Q2) is used as the buffer amplifier 20 and as a gated modulator. The upper gate circuit acts as a buffer amplifier isolating the loading effects of the antenna under test and mismatches from the RF oscillator 10, thereby preventing changes in RF signal level or frequency. The lower gate 100% modulates the RF signal by switching the MOSFET Q2 on and off with a square wave signal from square wave generator 30. The output of MOSFET Q2 across inductor L2 is a RF pulse burst having the same duty cycle as square wave generator 30. Resistors R5 and R6 act as bleeder resistors keeping the gates at DC ground. Inductor L2 is selectively tapped for an output impedance, for example, 50 ohms, to match the characteristic impedance of the directional coupler 50.

Square wave generator 30 utilizes a LM555 standard timer circuit 42 operated at a 50% duty cycle in an astable mode. Resistors R1 and R2, and capacitor C5 comprise frequency determining components, and the values shown are for a 50% duty cycle at 1 KHz. Resistor R1 is adjustable to allow for fine tuning. Inductor L3 and capacitors C4 and C7 decouple the timer circuit from the DC supply voltage. Capacitor C6 is a bypass capacitor and C8 is a DC blocking and output coupling capacitor to the lower gate of MOSFET Q2. Switch S3 allows for selection of either a modulated or continuous wave (CW) RF signal. The invention is normally used as a VSWR indicator with the switch in the modulated (closed) position. This will result in the output of MOSFET Q2 producing a modulated RF signal. However, in the open position, the output of MOSFET Q2 is a continuous unmodulated signal which may be used, for example, to adjust the RF frequency with a frequency counter.

The output of MOSFET Q2 is coupled through DC blocking capacitor C11 to 6 dB attenuator pad 40. The pad comprises resistors R7, R8 and R9 with values selected to form an input/output impedance to match the characteristic impedance of the directional coupler 50. The pad serves to isolate load impedance variations from the output of MOSFET Q2, thereby helping to maintain a constant signal level output and preventing miscalibration of the instrument. The output of the 6 dB pad 40 is connected directly to dual directional coupler 50. For purposes of the invention, a conventional −20 dB, 100–500 MHz, 50 ohm characteristic impedance coupler is used, although couplers of other characteristic impedance may also be used. Capacitors C12 and C13 provide port coupling to matched termination resistors R10 and R11, and provide DC blocking between the RF signal and a detector diode D1 in RF detector and filter circuit 60. Test switch S2 and resistor R12 provide a directional coupler bypass path as will be described later.

Detector diode D1 is forward biased just beyond the threshold of conduction to maximize RF detection sensitivity. The bias current is supplied to detector diode D1 from the DC supply voltage through a resistor R33, and resistor R13 acts as the DC return. Capacitor C14 and C15, and inductor L5 form a low pass filter bypassing to ground the RF component of the detected signal.

The output of RF detector and filter circuit 60 is the audio modulation component of the reflected RF signal from the antenna (load) under test at connecting coaxial cable connector 4, and is directly related to the square of the reflection coefficient ($\rho$) of the impedance mismatch of the load. The voltage reflection coefficient ($\rho$) is defined as $$\rho = \frac{Z_O - Z_L}{Z_O + Z_L}$$

where $Z_o$ is the characteristic impedance (e.g. 50 ohms) of the directional coupler 50, and $Z_L$ is the impedance of the load at coaxial cable connector 4.

The power reflected ($P_r$) from the load at coaxial cable connector 4 due to the mismatch, is given by the equation $$P_r = \rho^2 P_F$$

where $P_F$ is the forward traveling power to the load.

VSWR is a nonlinear function of the reflected power from the mismatch at coaxial cable connector 4, and is defined as $$VSWR = \frac{1 + |\rho|}{1 - |\rho|}$$

-continued $$VSWR = \frac{1 + \sqrt{P_R/P_F}}{1 - \sqrt{P_R/P_F}}$$

$$VSWR = \frac{\sqrt{P_F} + \sqrt{P_R}}{\sqrt{P_F} - \sqrt{P_R}}$$

If $P_F$ is taken as the normalizing reference level, then $$VSWR = \frac{1 + \sqrt{P_R}}{1 - \sqrt{P_R}}$$

After detection and filtering, the 1 KHz square wave modulation component of the reflected power is coupled through DC blocking capacitor C16 to narrowband active filter amplifier 70. The amplifier circuit comprises three operational amplifiers (Op Amps) U1A, U1B, and U1C. Commercially available amplifiers, such as LM3900 quad linear amplifiers are preferable so that all three OP Amps may be contained in a single integrated circuit to minimize variations in filter center frequency, bandwidth, and gain with temperature. Resistor and capacitor components R14–R27 and C17–C19 complete the narrowband filter and amplifier circuit. The circuit is a known configuration and is not described in detail. The gain of the filter amplifier may be adjusted by resistor R14 without affecting center frequency or bandwidth. The circuit provides very selective stable amplification of the modulation component of the reflected power while blocking interfering signals which may be received by the antenna under test.

A display rectifier diode D2 rectifies the amplified 1 KHz modulation component into a DC voltage proportional to the magnitude of the reflected power from the load mismatch. Capacitor C20 and resistor R28 and R32 provide filtering and a DC voltage return path.

Figure 4:
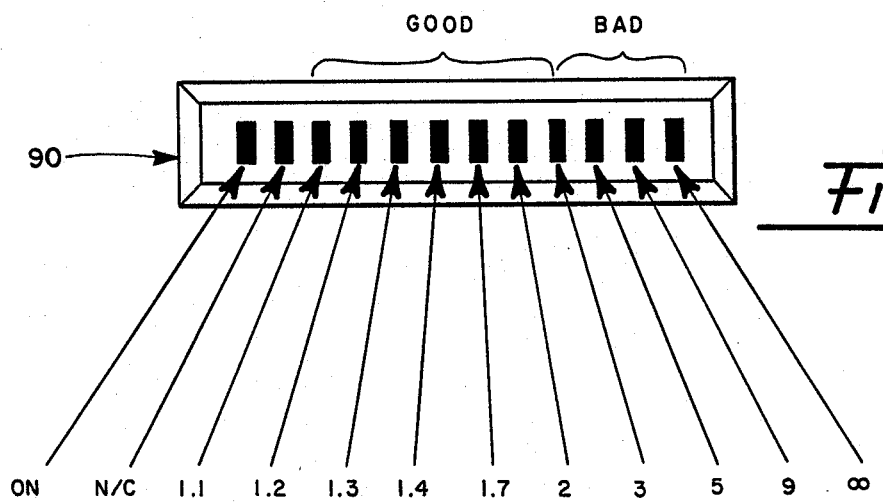
FIG. 4 is an enlarged view of the LED moving dot readout display.

The output of display rectifier diode D2 drives a conventional LM3016N or comparable Dot/Bar display driver 80 and FNA-12 LED display 90. To calibrate the display, the gain of filter amplifier 70 is set by resistor R14 such that the voltage at input pin 5 of driver 80 illuminates the LED on FNA-12 play 90 corresponding to a 3:1 VSWR reading (See FIG. 4). Calibration is made with no load connected to coaxial cable connector 4, and with test switch S2 closed. In operation with an antenna or other load under test, the driver 80 will step sequentially up or down a LED display element every 3 dB change in input level. The driver is preferably connected in the dot mode so only one LED element is illuminated at a time, with resistor R29 controlling the brightness of the LED display. VSWR readings correspond to the incremental steps are marked on the face of the display, as shown in greater detail in FIG. 4. The FNA-12 LED display has twelve positions, ten of which are used to indicate VSWR. One other position is used as an indication that the unit is turned on. Resistors R30 and R31 act as current limiting resistors for the LEDs.

In actual use with the unit turned on and no antenna connected at coaxial cable connector 4, the two outermost LED segments will illuminate. The LED segment on the left indicates that the tester is on. With no antenna or load connected, VSWR will show a reading of infinity as indicated by the lighted LED segment on the right side of the display. Test switch S2 provides verification for the operator that the unit is functioning properly and may also be used as a reference point when working in poor light.

When an antenna or other load is connected to coaxial cable connectors 4, the unit will measure the VSWR of the load and indicate the value on the right side of the display. The better the antenna match, the further an illuminated LED segment moves from the far right (indicating a "bad" match) to the left (indicating a "good" match). Actual load VSWR is determined by the individual LED segment lighted. The moving dot display is especially helpful in situations where an operator may not be concerned with obtaining an absolute reading, but rather may be verifying that the VSWR is below a certain ratio, for example, 2 or perhaps 1.5. This can readily be determined from the display. Also if the operator is tuning an installed antenna the moving dot display indicates very clearly and easily when the best match i.e. lowest VSWR is attained.

Thus while preferred constructional features of the invention are embodied in the structure illustrated herein, it is to be understood that changes and variations may be made by those skilled in the art without departing from the spirit and scope of the invention. For example, the invention has been described for use in testing antenna having 50 ohm impedance. However, the circuitry may easily be modified for tuning antennas of different impedance values.

I claim:

1. A self contained pocket size antenna match indicating device that provides an instantaneous measurement of voltage standing wave radio (VSWR), said device comprising:
   oscillator means for generating a modulated low level RF power signal;
   means for connecting said signal to a load under test, said means including dual directional coupler means for sampling the forward and reflected flow of said power signal;
   means including a diode and a low pass filter for detecting modulated reflected flow of said power signal and to produce a voltage directly proportional to load mismatch, the detecting means having an output applied to a narrowband active filter amplifier circuit means which amplifies the modulated component of the reflected power and blocks interfering signals;
   a rectifying diode coupled to said narrowband active filter amplifier circuit means and converting the modulated component of the reflected flow to a DC voltage directly related to the square of the voltage reflection coefficient ($\rho$), and
   digital display means connected to the rectifying diode for converting said DC voltage to a visual indication of VSWR.

2. The indicating device of claim 1, wherein said oscillator means includes an oscillator circuit coupled to a buffer amplifier, said oscillator circuit producing a low level RF signal which is supplied to said buffer amplifier.

3. The indicating device of claim 2, wherein said oscillator circuit and said buffer amplifier include dual gate MOSFET devices.

4. The indicating device of claim 2, further including a square wave generating means coupled to said buffer amplifier for modulating the RF signal produced by said oscillator circuit to produce said modulated low level RF power signal.

5. The indicating device of claim 1, wherein said oscillator means is isolated from said load under test by an attenuating pad.

6. The indicating device of claim 1, wherein said narrowband active filter amplifier circuit means includes three operational amplifiers.

7. The indicating device of claim 1, wherein said digital display means includes a multiple output terminal dot display driver means, said driver means calibrated in terms of VSWR to provide a signal on a different one of said output terminals depending on the value of said DC voltage.

8. The indicating device of claim 7, wherein said multiple output dot display driver means increments a different output terminal every 3 dB change in DC voltage signal level.

9. The device of claim 8, further including a multi segment light emitting diode (LED) display connected to said multiple output terminal dot display driver means, individual segments of said multiple segment LED display being connected to different output terminals and illuminated by a signal on said output terminals.

10. The device of claim 9, wherein individual segments of said multi segment LED display provide a readout of VSWR values.

11. The device of claim 10, wherein said individual segments comprise a moving dot display representing a range of VSWR measurements decreasing in ratio moving in one direction and increasing in ratio moving in a second direction.

12. The device of claim 1, wherein said device is contained in a housing having an opening therein for said digital display means, and wherein said means for connecting said signal to said load under test includes a transmission line connection means on said housing.

13. A self contained pocket size antenna match indicating device that provides an instantaneous measurement of voltage standing wave ratio (VSWR), said device comprising:

oscillator means for generating a modulated low level RF power signal;

means for connecting said signal to a load under test, said means including dual directional coupler means for sampling the forward and reflected flow of said power signal;

means for detecting modulated reflected flow of said power signal to produce a voltage directly proportional to load mismatch;

digital display means connected to the detecting means for converting said voltage to a visual indication of VSWR; and means for adjusting the frequency of said RF power signal, said last mentioned means including switch means for selectively altering said oscillator means to produce a continuous wave (CW) RF signal.

* * * * *